US009768310B2

(12) United States Patent
Ahn et al.

(10) Patent No.: US 9,768,310 B2
(45) Date of Patent: Sep. 19, 2017

(54) THIN FILM TRANSISTOR, ORGANIC LIGHT-EMITTING DIODE DISPLAY INCLUDING THE SAME, AND MANUFACTURING METHOD THEREOF

(71) Applicant: Samsung Display Co., Ltd, Yongin, Gyeonggi-Do (KR)

(72) Inventors: Ki Wan Ahn, Seoul (KR); Joo Sun Yoon, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/712,726

(22) Filed: May 14, 2015

(65) Prior Publication Data
US 2016/0149052 A1 May 26, 2016

(30) Foreign Application Priority Data

Nov. 25, 2014 (KR) ........................ 10-2014-0165621

(51) Int. Cl.
*H01L 29/786* (2006.01)
*H01L 29/423* (2006.01)
(Continued)

(52) U.S. Cl.
CPC .... *H01L 29/78648* (2013.01); *H01L 27/3262* (2013.01); *H01L 29/1604* (2013.01);
(Continued)

(58) Field of Classification Search
CPC ........... H01L 29/42392; H01L 29/6675; H01L 2924/13085; H01L 2924/13092
See application file for complete search history.

(56) References Cited

U.S. PATENT DOCUMENTS 5,818,070 A * 10/1998 Yamazaki ............. H01L 29/458
257/270
6,504,593 B1 * 1/2003 Noritake ........... G02F 1/136227
349/113
(Continued)

FOREIGN PATENT DOCUMENTS

KR          10-0557730 B1      2/2006
KR          10-0770470 B1      10/2007
KR       10-2011-0069908 A     6/2011

OTHER PUBLICATIONS

Surround. (n.d.) Collins English Dictionary—Complete and Unabridged, 12th Edition 2014. (1991, 1994, 1998, 2000, 2003, 2006, 2007, 2009, 2011, 2014). Retrieved Feb. 1, 2017 from http://www.thefreedictionary.com/surround.*

*Primary Examiner* — Caridad Everhart
*Assistant Examiner* — Mikka Liu
(74) *Attorney, Agent, or Firm* — Knobbe Martens Olson & Bear LLP

(57) ABSTRACT

A TFT, OLED display including the same, and manufacturing method thereof are disclosed. In one aspect, the TFT includes a first gate electrode formed over a substrate and a first insulating layer formed over the substrate and the first gate electrode. A semiconductor layer is formed over the first insulating layer, the semiconductor layer at least partially overlapping the first gate electrode. A second insulating layer is formed over the first insulating layer and the semiconductor layer, the first and second insulating layers having a pair of connection holes formed therethrough. A second gate electrode is electrically connected to the first gate electrode via the connection holes, the connection holes respectively exposing portions of the first gate electrode. Source and drain electrodes are formed over a third insulating layer and electrically connected to the semiconductor (Continued)

layer via the contact holes, the contact holes respectively exposing portions of the semiconductor layer.

25 Claims, 15 Drawing Sheets

(51) Int. Cl.
    *H01L 29/66*      (2006.01)
    *H01L 27/32*      (2006.01)
    *H01L 29/16*      (2006.01)
    *H01L 29/24*      (2006.01)

(52) U.S. Cl.
    CPC ........ *H01L 29/24* (2013.01); *H01L 29/42392* (2013.01); *H01L 29/6675* (2013.01); *H01L 29/66969* (2013.01); *H01L 29/7869* (2013.01); *H01L 29/78663* (2013.01); *H01L 29/78672* (2013.01)

(56) References Cited

U.S. PATENT DOCUMENTS

| | | | |
|---|---|---|---|
| 2011/0147755 A1* | 6/2011 | Miyairi | H01L 29/66765 257/60 |
| 2012/0256184 A1* | 10/2012 | Kaneko | H01L 29/78621 257/59 |
| 2013/0088460 A1 | 4/2013 | Ahn et al. | |
| 2013/0122673 A1 | 5/2013 | Wang et al. | |

\* cited by examiner

US 9,768,310 B2

THIN FILM TRANSISTOR, ORGANIC LIGHT-EMITTING DIODE DISPLAY INCLUDING THE SAME, AND MANUFACTURING METHOD THEREOF

CROSS-REFERENCE TO RELATED APPLICATION

This application claims priority to and the benefit of Korean Patent Application No. 10-2014-0165621 filed in the Korean Intellectual Property Office on Nov. 25, 2014, the entire contents of which are incorporated herein by reference.

BACKGROUND

Field

The described technology generally relates to a TFT, an organic light-emitting diode display including the same, and a manufacturing method thereof.

Description of the Related Technology

An organic light-emitting diode (OLED) display includes two electrodes and an organic emission layer positioned therebetween. An OLED emits light when an electron injected from a cathode electrode and a hole injected from an anode electrode are combined in the organic emission layer to form an exciton, which discharges energy.

The OLED display includes a plurality of pixels, each pixel including an OLED configured by formation of the cathode, the anode, and the organic emission layer. In each pixel, a plurality of thin film transistors (TFTs) and capacitors for driving the OLED are formed. The TFTs generally include a switching TFT and a driving TFT.

SUMMARY OF CERTAIN INVENTIVE ASPECTS

Inventive aspects are a TFT, an OLED display including the same, and a manufacturing method thereof having advantages of maximizing charge mobility and reduce or minimize leakage current.

Another aspect is a thin film transistor (TFT) for a display device, comprising a substrate, a first gate electrode formed over the substrate, a first insulating layer formed over the substrate and the first gate electrode, and a semiconductor layer formed over the first insulating layer, wherein the semiconductor layer at least partially overlaps the first gate electrode. The TFT also includes a second insulating layer formed over the first insulating layer and the semiconductor layer, wherein the first and second insulating layers have a pair of connection holes formed therethrough. The TFT further includes a second gate electrode electrically connected to the first gate electrode via the connection holes, wherein the connection holes respectively expose portions of the first gate electrode. The TFT also includes a third insulating layer formed over the second gate electrode and the second insulating layer, wherein the second and third insulating layers have a pair of contact holes formed therethrough, and source and drain electrodes formed over the third insulating layer and electrically connected to the semiconductor layer via the contact holes, wherein the contact holes respectively expose portions of the semiconductor layer.

In the above TFT, the second gate electrode includes i) a second horizontal gate electrode formed over the second insulating layer and at least partially overlapping the semiconductor layer and the first gate electrode and ii) a pair of second vertical gate electrodes respectively formed in the connection holes.

In the above TFT, the second vertical gate electrodes extend downwardly from different portions of the second horizontal gate electrode.

In the above TFT, the semiconductor layer is formed of polysilicon.

In the above TFT, the semiconductor layer includes i) a channel region including first and second ends opposing each other, the channel region at least partially overlapping the first gate electrode and the second horizontal gate electrode and ii) source and drain regions respectively formed at the first and second ends of the channel region, wherein the first gate electrode, the second horizontal gate electrode, and the second vertical gate electrodes surround the channel region.

In the above TFT, the second vertical gate electrodes respectively contact the source and drain regions.

In the above TFT, the second vertical gate electrodes respectively contact the exposed portions of the first gate electrode.

The above TFT further comprises a gate line configured to transmit a gate signal to the first gate electrode, wherein the first gate electrode is electrically connected to an end of the gate line, and wherein the second horizontal gate electrode has a substantially rectangular shape in a plan view.

The above TFT further comprises a gate line configured to transmit a gate signal to the first gate electrode and an auxiliary gate line at least partially overlapping the gate line, wherein the first gate electrode is electrically connected to an end of the gate line, and wherein the second horizontal gate electrode is electrically connected to an end of the auxiliary gate line.

In the above TFT, the first and second vertical and horizontal gate electrodes are connected to each other to form a closed loop.

Another aspect is a thin film transistor (TFT), comprising a substrate, a first gate electrode formed over the substrate, a first insulating layer formed over the substrate and the first gate electrode, and a semiconductor layer formed over the first insulating layer, wherein the semiconductor layer at least partially overlaps the first gate electrode. The TFT also comprises source and drain electrodes respectively contacting portions of the semiconductor layer and separated from each other and a second insulating layer formed over the semiconductor layer and the source and drain electrodes, wherein the first and second insulating layers have a pair of connection holes formed therethrough. The TFT further comprises a second gate electrode electrically connected to the first gate electrode via the connection holes, wherein the connection holes respectively expose portions of the first gate electrode, and a third insulating layer formed over the second gate electrode and the second insulating layer.

In the above TFT, the second gate electrode includes i) a second horizontal gate electrode formed over the second insulating layer and at least partially overlapping the semiconductor layer and the first gate electrode and ii) a pair of second vertical gate electrodes respectively formed in the connection holes.

In the above TFT, the second vertical gate electrodes respectively extend downwardly from different portions of the second horizontal gate electrode.

In the above TFT, the semiconductor layer is formed of an amorphous silicon or oxide semiconductor material.

In the above TFT, the semiconductor layer includes i) a channel region including first and second ends opposing each other, the channel region at least partially overlapping the first gate electrode and the second horizontal gate electrode and ii) source and drain regions respectively formed at the first and second ends of the channel region, wherein the first gate electrode, the second horizontal gate electrode, and the second vertical gate electrodes surround the channel region.

In the above TFT, the second vertical gate electrodes respectively contact the source and drain regions.

The above TFT further comprises a source ohmic contact formed between the source electrode and the source region and a drain ohmic contact formed between the drain electrode and the drain region.

In the above TFT, the second vertical gate electrodes respectively contact the exposed portions of the first gate electrode.

An organic light-emitting diode (OLED) display, comprising a substrate, a thin film transistor (TFT) formed over the substrate and an OLED connected to the TFT. The TFT includes a first gate electrode formed over the substrate, a first insulating layer formed over the substrate and the first gate electrode, and a semiconductor layer formed over the first insulating layer, wherein the semiconductor layer at least partially overlaps the first gate electrode. The TFT further includes a second insulating layer formed over the first insulating layer and the semiconductor layer, wherein the first and second insulating layers have a pair of connection holes formed therethrough, and a second gate electrode electrically connected to the first gate electrode via the connection holes, wherein the connection holes respectively expose a portion of the first gate electrode, respectively. The TFT also includes a third insulating layer formed over the second gate electrode and the second insulating layer, wherein the second and third insulating layers have a pair of contact holes formed therethrough, and source and drain electrodes formed over the third insulating layer and electrically connected to the semiconductor layer via the contact holes, wherein the contact holes expose the portion of the semiconductor layer.

In the above OLED, the second gate electrode includes i) a second horizontal gate electrode formed over the second insulating layer and at least partially overlapping the semiconductor layer and the first gate electrode and ii) a pair of second vertical gate electrodes respectively formed in the connection holes.

In the above OLED, the semiconductor layer includes i) a channel region including first and second ends opposing each other, the channel region at least partially overlapping the first gate electrode and the second horizontal gate electrode and ii) source and drain regions respectively formed at the first and second ends of the channel region, wherein the first gate electrode, the second horizontal gate electrode, and the second vertical gate electrodes surround the channel region.

In the above OLED, the second vertical gate electrodes respectively contact the source and drain regions.

Another aspect is a manufacturing method of a thin film transistor (TFT), comprising forming a first gate electrode over a substrate, wherein the first gate electrode has two ends. The method also comprises forming a first insulating layer over the first gate electrode, forming a semiconductor layer, having two ends, over the first insulating layer so as to at least partially overlap the first gate electrode. The method also comprises forming a second insulating layer over the first insulating layer and the semiconductor layer, wherein the first and second insulating layers have a pair of connection holes formed therethrough, and wherein the connection holes respectively expose the ends of the first gate electrode. The method also comprises forming a second gate electrode over the second insulating layer, wherein the second gate electrode is electrically connected to the first gate electrode via the connection holes. The method also comprises forming a third insulating layer over the second gate electrode and the second insulating layer, wherein the second and third insulating layers have a pair of contact holes formed therethrough, and wherein the contact holes respectively expose the ends of the semiconductor layer. The method also comprises forming source and drain electrodes over the third insulating layer, wherein the source and drain electrodes are electrically connected to the semiconductor layer via the contact holes.

In the above method, the second gate electrode includes i) a second horizontal gate electrode formed over the second insulating layer and at least partially overlapping the semiconductor layer and the first gate electrode and ii) a pair of second vertical gate electrodes respectively formed in the connection holes.

In the above method, the semiconductor layer includes i) a channel region including first and second ends opposing each other, the channel region at least partially overlapping the first gate electrode and the second horizontal gate electrode, wherein the first gate electrode, the second horizontal gate electrode, and the second vertical gate electrodes surround the channel region.

According to at least one of the disclosed embodiments, by forming the first gate electrode, the second horizontal gate electrode, and the second vertical gate electrode surrounding all sides of a channel region of the semiconductor, when the gate signal is applied, all of lower, upper, and both-side portions of the channel region are used as the current path to improve charge mobility.

Further, when the TFT is in an off state, the current path is blocked at all of the lower, upper, and both-side portions of the channel region to reduce or minimize the leakage current.

Further, the second horizontal gate electrode is formed as a part of the auxiliary gate line overlapping with the gate line to reduce resistance of the gate line.

DETAILED DESCRIPTION OF CERTAIN INVENTIVE EMBODIMENTS

Figure 1:
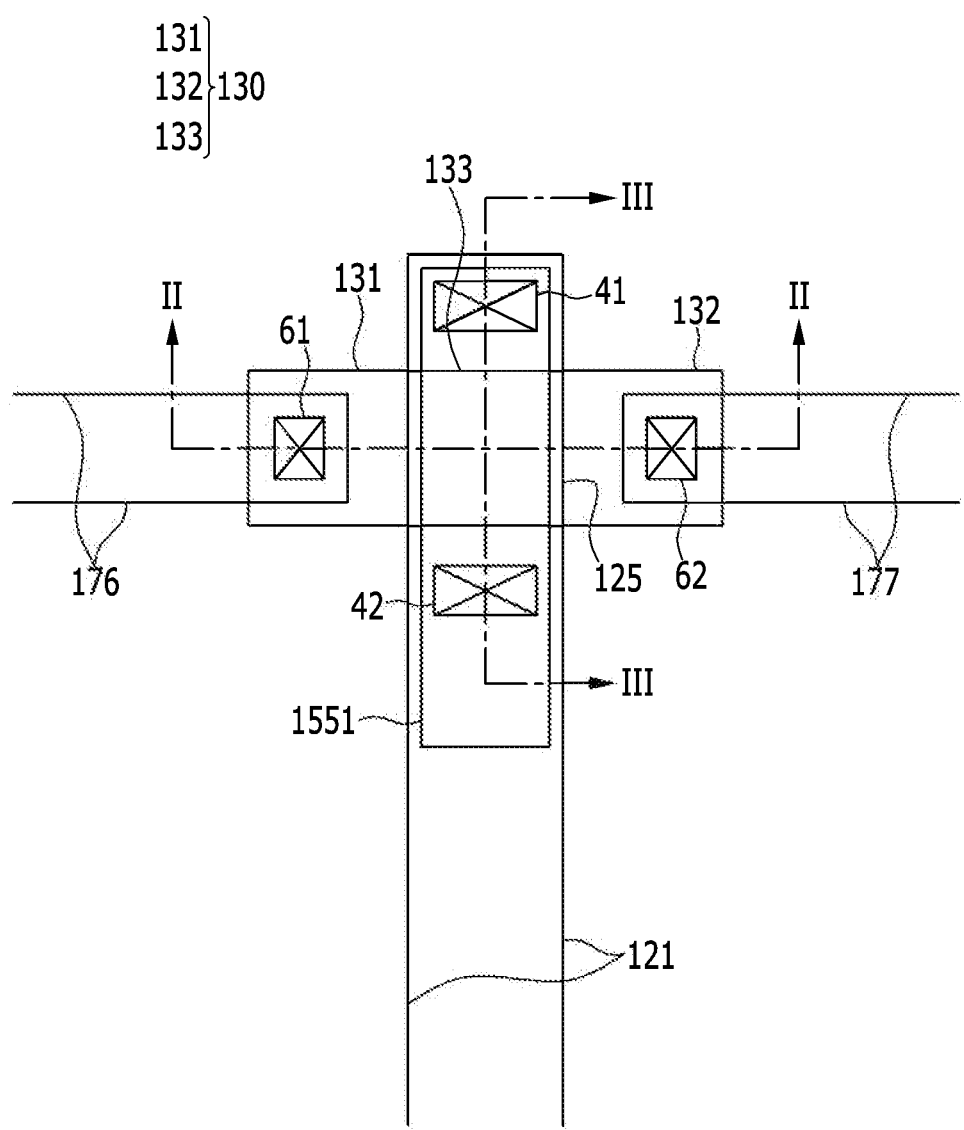
FIG. 1 is a layout view of a TFT according to an exemplary embodiment.

In order to improve charge mobility and reduce or minimize leakage current, a double gate type TFT can be utilized. This type of TFT provides a larger current path to improve such characteristics. However, since the double gate type TFT uses only the current paths at the top and bottom of the semiconductor, the remaining (middle) portion of the semiconductor is not used to form the current path.

The present disclosure will be described more fully hereinafter with reference to the accompanying drawings, in which exemplary embodiments are shown. As those skilled in the art would realize, the described embodiments can be modified in various different ways, all without departing from the spirit or scope of the present disclosure.

Accordingly, the drawings and description are to be regarded as illustrative in nature and not restrictive. Like reference numerals designate like elements throughout the specification.

In addition, the size and thickness of each configuration shown in the drawings are arbitrarily shown for understanding and ease of description, but the present disclosure is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements can also be present. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Then, a TFT according to an exemplary embodiment will be described in detail with reference to FIGS. 1 to 4.

Figure 2:
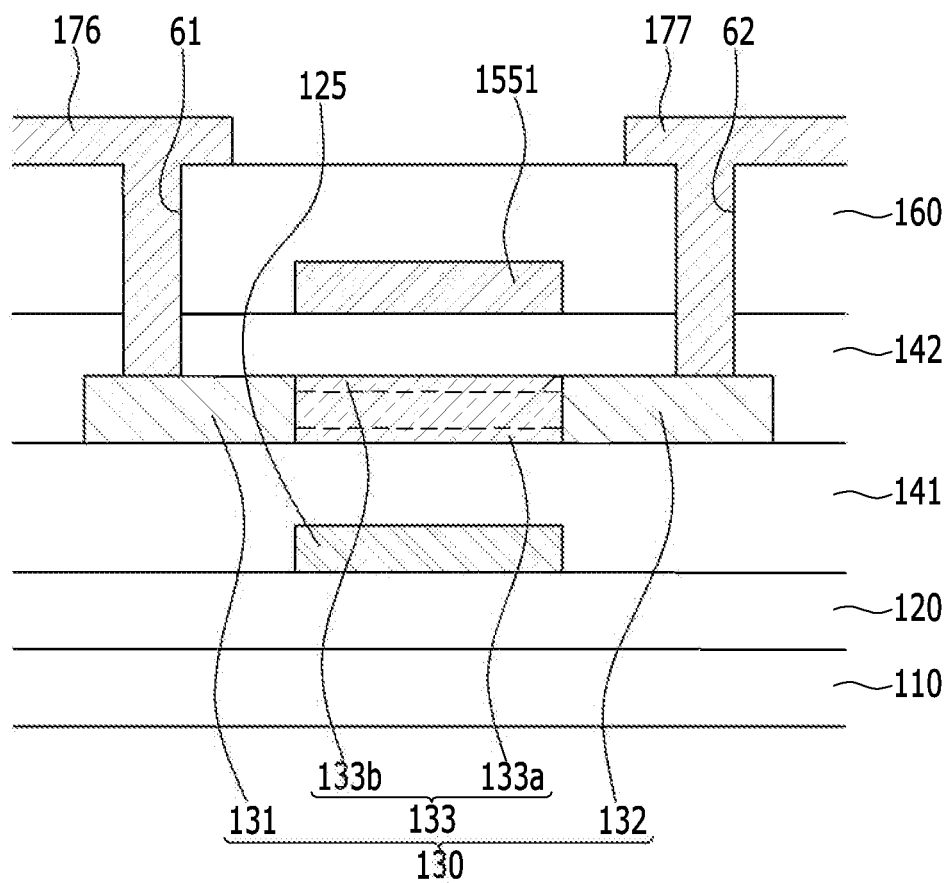
FIG. 2 is a cross-sectional view taken along line II-II of FIG. 1.
Figure 3:
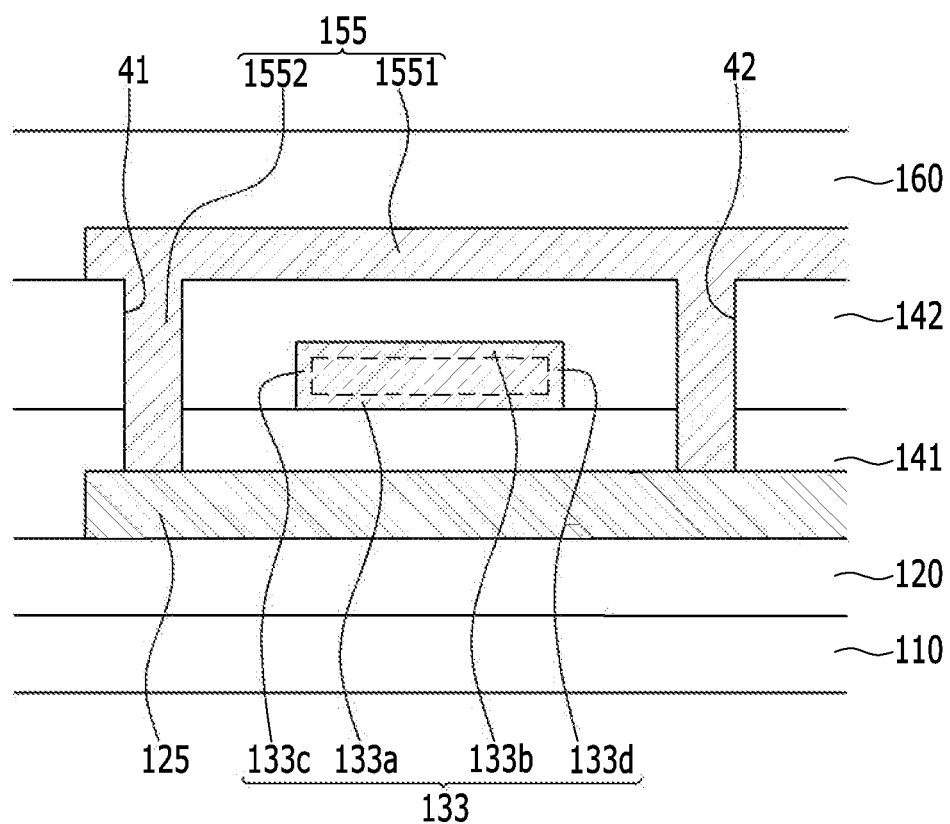
FIG. 3 is a cross-sectional view taken along line III-III of FIG. 1.
Figure 4:
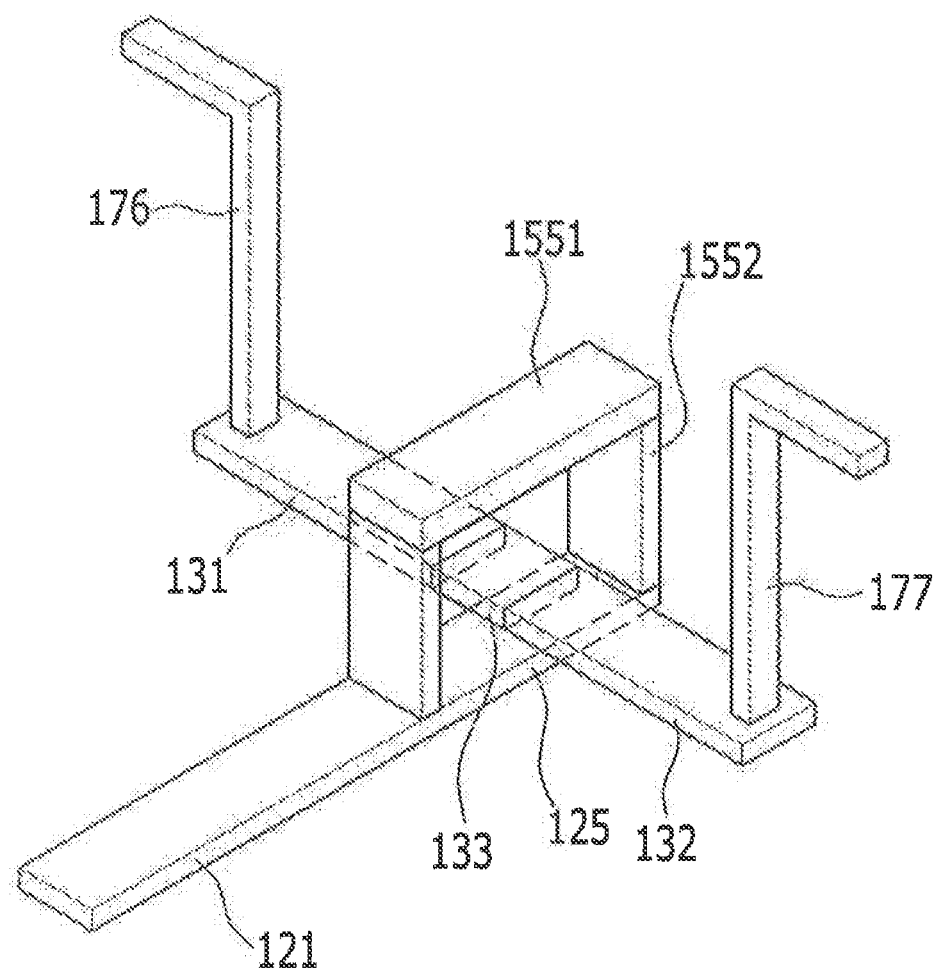
FIG. 4 is a perspective view of a main part of the TFT according to the exemplary embodiment.

FIG. 1 is a layout view of a TFT according to an exemplary embodiment. FIG. 2 is a cross-sectional view taken along line II-II of FIG. 1, FIG. 3 is a cross-sectional view taken along line III-III of FIG. 1. and FIG. 4 is a perspective view of a main part of the TFT according to the exemplary embodiment.

As illustrated in FIGS. 1 to 4, in the TFT, a buffer layer 120 is formed on a substrate 110 formed of transparent glass, plastic, or the like. The buffer layer 120 can serve to improve a characteristic of polysilicon by blocking impurities from the substrate 110 during a crystallization process for forming polysilicon and reduce stress applied to the substrate 110.

A first gate electrode 125 is formed on the buffer layer 120. The first gate electrode 125 corresponds to an end of a gate line 121 transferring a gate signal. In the exemplary embodiment, the gate line 121 extends in a vertical direction, but is not necessarily limited thereto and can have various structures.

On the first gate electrode 125 and the buffer layer 120, a first insulating layer 141 covering the first gate electrode 125 and the buffer layer 120 is formed. The first insulating layer 141 covers the first gate electrode 125 to insulate the first gate electrode 125 and the buffer layer 120 from each other. The first insulating layer 141 can be formed of silicon nitride (SiNx) or silicon oxide (SiOx).

A semiconductor or semiconductor layer 130 is formed on the first insulating layer 141. The semiconductor 130 is formed to cross the first gate electrode 125. In the exemplary embodiment, the semiconductor 130 has a long rectangular shape in a horizontal direction in a plan view, but is not necessarily limited thereto and can have various structures. The semiconductor 130 includes a channel region 133 overlapping the first gate electrode 125, and a source region 131 and a drain region 132 positioned at both ends of the channel region 133, respectively. The semiconductor 130 can be formed of polysilicon, the channel region 133 is channel-doped with an N-type impurity or a P-type impurity, and the source region 131 and the drain region 132 are source/drain-doped at a higher doping concentration than the channel region 133.

On the semiconductor 130 and the first insulating layer 141, a second insulating layer 142 formed of silicon nitride (SiNx) or silicon oxide (SiOx) is formed. A pair of connection holes 41 and 42 exposing both ends of the first gate electrode 125 is formed in the first and second insulating layers 141 and 142.

A second gate electrode 155 is formed in the connection holes 41 and 42 and on the second insulating layer 142. In the exemplary embodiment, the second gate electrode 155 has a long rectangular shape in a vertical direction in a plan view, but is not necessarily limited thereto and can have various structures. The second gate electrode 155 includes a second horizontal gate electrode 1551 which is formed on the second insulating layer 142 and overlaps the channel region 133 of the semiconductor 130 and the first gate electrode 125, and a pair of second vertical gate electrodes 1552 filled in the pair of connection holes 41 and 42. The second horizontal gate electrode 1551 is an island type in a plan view.

A pair of second vertical gate electrodes 1552 is extended downward from both ends of the second horizontal gate electrode 1551 and contacts both ends of the first gate electrode 125, respectively. Accordingly, the second gate electrode 155 is connected to the first gate electrode 125 through the connection holes 41 and 42. In this case, the first gate electrode 125 faces the bottom of the channel region 133, the second horizontal gate electrode 1551 faces the top of the channel region 133, and the second vertical gate electrodes 1552 face both sides or lateral sides of the channel region 133, respectively. Accordingly, the first gate electrode 125, the second horizontal gate electrode 1551 and the second vertical gate electrode 1552 surround all sides of the channel region 133. In this case, when the gate signal is applied to the first gate electrode 125, the second horizontal gate electrode 1551 and the second vertical gate electrode 1552, a lower portion 133a, an upper portion 133b, and two sides 133c and 133d of the channel region 133 are used as a current path to improve charge mobility. Further, when the TFT is in an off state, the current path is blocked from the lower portion 133a, the upper portion 133b, and the two sides 133c and 133d of the channel region 133 to minimize leakage current.

Meanwhile, on the second gate electrode 155 and the second insulating layer 142, a third insulating layer 160 formed of silicon nitride (SiNx) or silicon oxide (SiOx) is formed and covers the second gate electrode 155 to insulate the second gate electrode 155 and the second insulating layer 142 from each other.

A source electrode 176 and a drain electrode 177 are formed on the third insulating layer 160. The source and drain electrodes 176 and 177 are formed on the second and third insulating layers 142 and 160 to be connected to the source and drain regions 131 and 132 through the contact holes 61 and 62 respectively exposing the source and drain regions 131 and 132.

Hereinafter, a manufacturing method of the TFT according to the exemplary embodiment will be described in detail with reference to the accompanying drawings.

Figure 5:
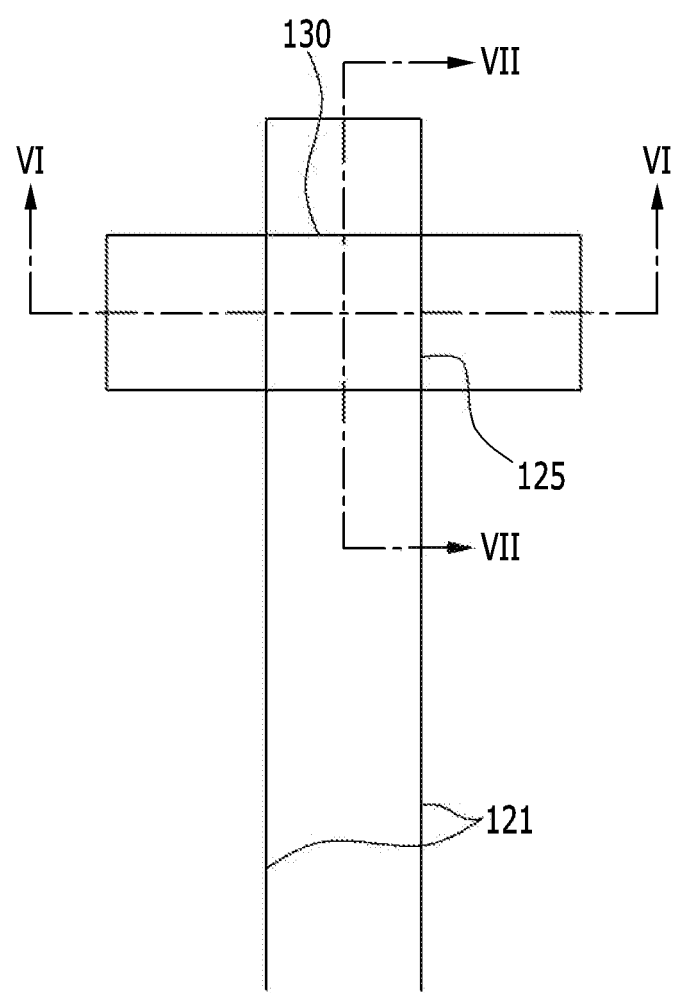
FIGS. 5 and 8 are layout views sequentially illustrating a manufacturing method of the TFT according to the exemplary embodiment.
Figure 6:
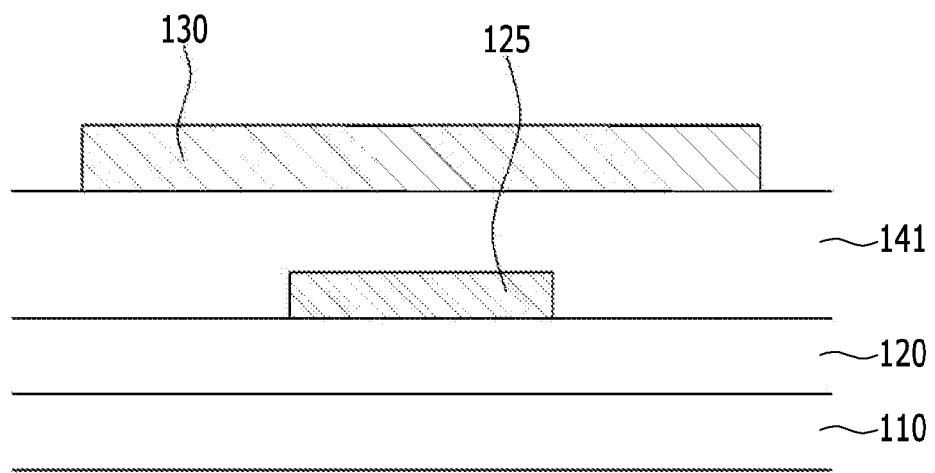
FIG. 6 is a cross-sectional view of the OLED display of FIG. 5 taken along line VI-VI.
Figure 7:
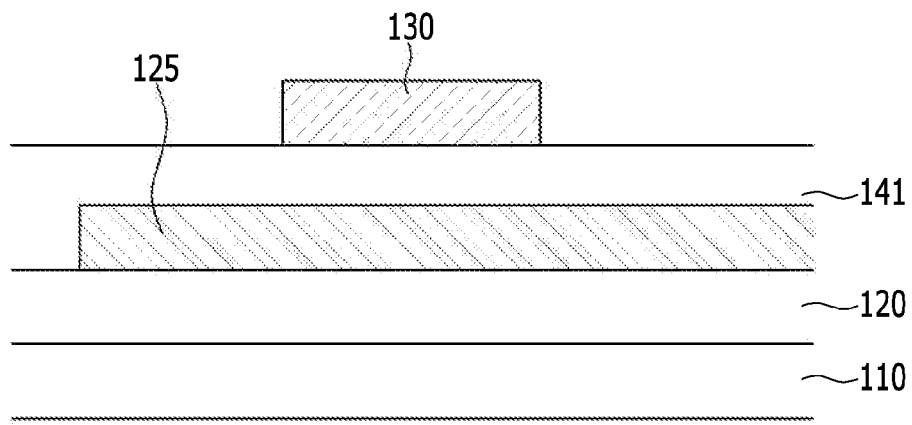
FIG. 7 is a cross-sectional view of the OLED display of FIG. 5 taken along line VII-VII.
Figure 8:
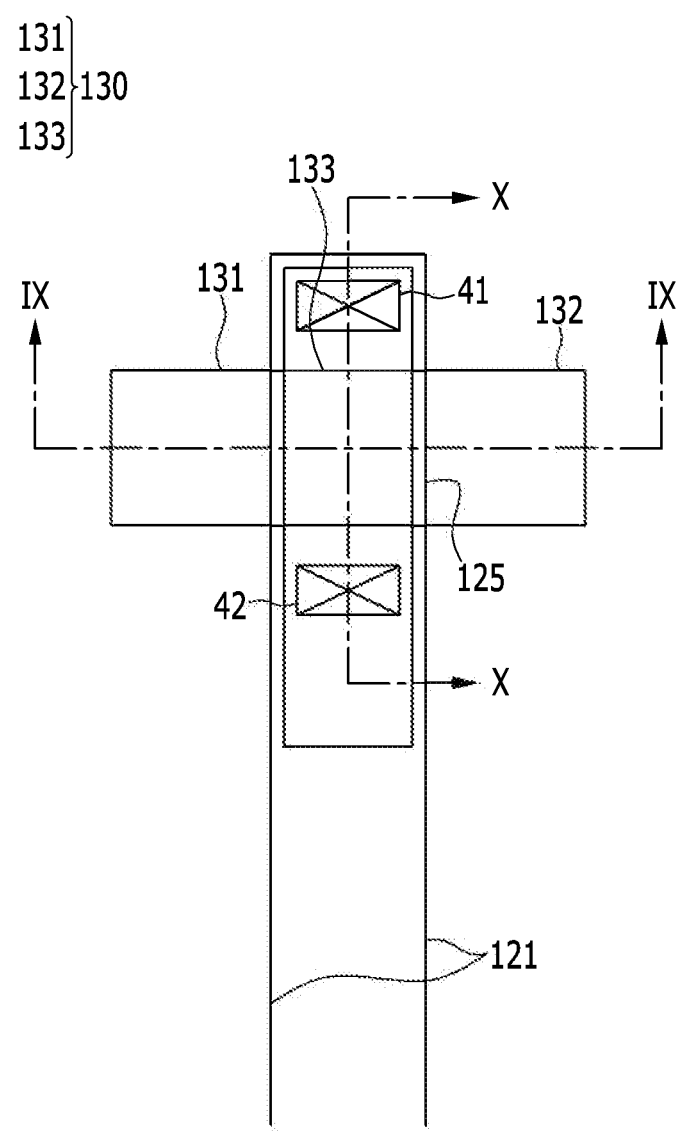
Figure 9:
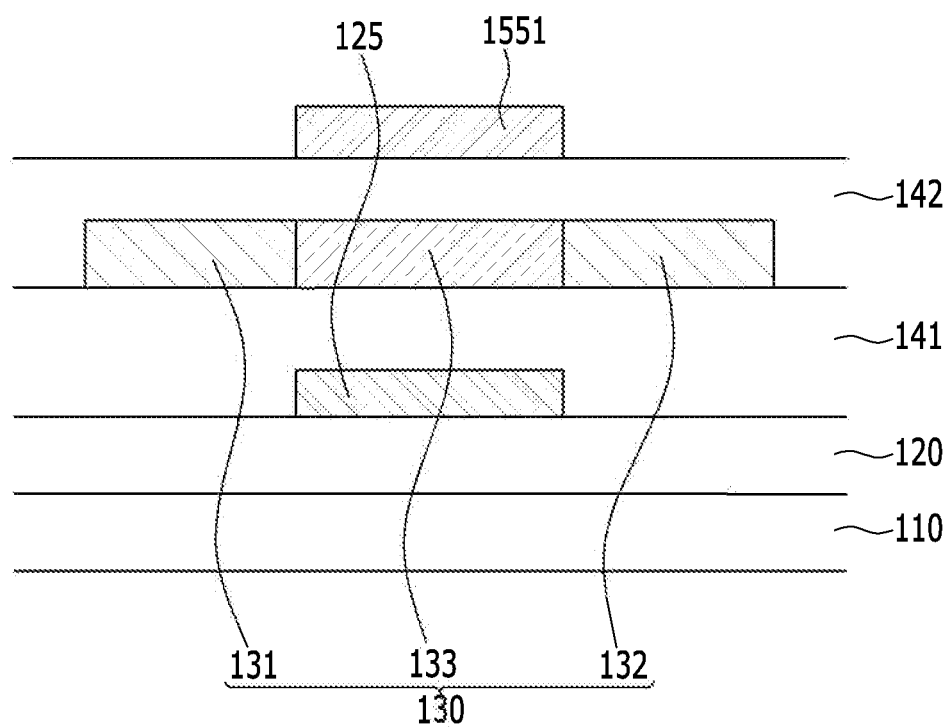
FIG. 9 is a cross-sectional view of the OLED display of FIG. 8 taken along line IX-IX.
Figure 10:
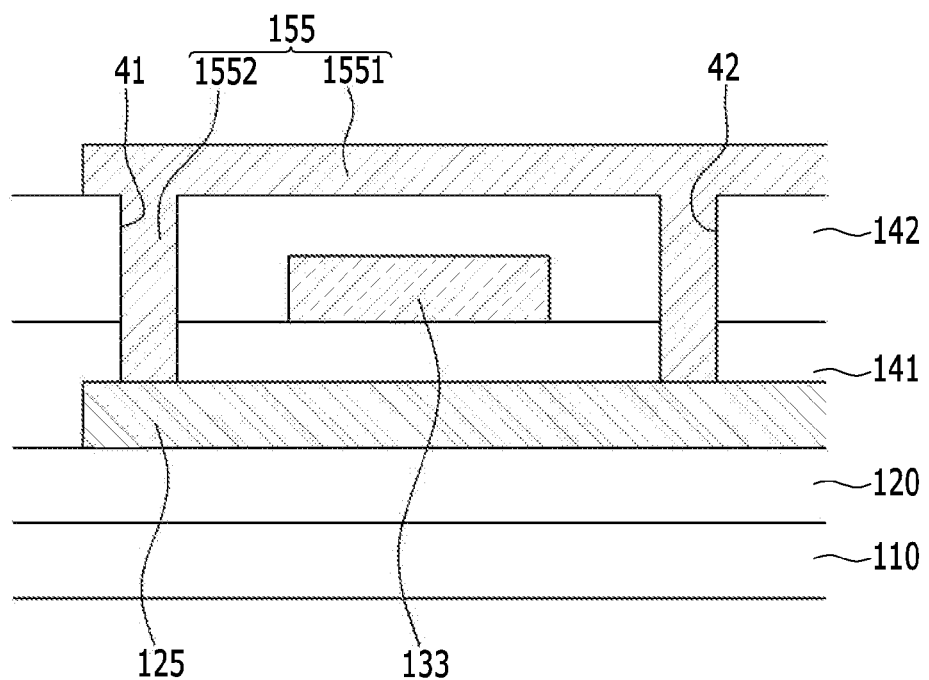
FIG. 10 is a cross-sectional view of the OLED display of FIG. 8 taken along line X-X.

FIGS. 5 and 8 are layout views sequentially illustrating a manufacturing method of the TFT according to the exemplary embodiment. FIG. 6 is a cross-sectional view of the OLED display of FIG. 5 taken along line VI-VI. FIG. 7 is a cross-sectional view of the OLED display of FIG. 5 taken along line VIII-VII. FIG. 9 is a cross-sectional view of the OLED display of FIG. 8 taken along line IX-IX. FIG. 10 is a cross-sectional view of the OLED display of FIG. 8 taken along line X-X.

First, as illustrated in FIGS. 5 to 7, the buffer layer 120 is formed on the substrate 110. The buffer layer 120 can be a single layer or a multilayer formed of silicon nitride (SiNx) and silicon oxide (SiOx) and deposited on the entire surface of the substrate 110 by a method such as plasma enhanced chemical vapor deposition (PECVD). In addition, a first gate metal layer is laminated on the buffer layer 120. The first gate metal layer can be formed as a multilayer in which a metal layer formed of any one of copper (Cu), a copper alloy, aluminum (Al), and an aluminum alloy and a metal layer formed of any one of molybdenum (Mo) and a molybdenum alloy are laminated. In addition, the first gate metal layer is patterned by a photolithography process using a first mask. As a result, a first gate wire including the gate line 121 and the first gate electrode 125 is formed. In addition, the first insulating layer 141 covering the buffer layer 120, the gate line 121, and the first gate electrode 125 is formed on the buffer layer 120, the gate line 121, and the first gate electrode 125. The first insulating layer 141 is formed by entirely depositing silicon nitride (SiNx) or silicon oxide ($SiO_2$) by a method such as PECVD. In addition, a polysilicon layer is laminated on the first insulating layer 141. The silicon layer is formed of polysilicon (p-Si), and the polysilicon can be formed by a method of forming and crystallizing amorphous silicon (a-Si). As the crystallization method, various known methods can be applied, and for example, the amorphous silicon can be crystallized by using heat laser, Joule heat, an electric field, catalyst metal, or the like. In addition, the polysilicon layer is patterned by a photolithography process using a second mask. As a result, the semiconductor 130 is formed. In this case, the semiconductor 130 is an intrinsic semiconductor which is not channel-doped with the impurity not to be divided to the channel region 133, the source region, and the drain region. In addition, the semiconductor 130 is made to an impurity semiconductor by performing channel-doping at a low doping concentration on the semiconductor 130.

Next, as illustrated in FIGS. 8 to 10, the second insulating layer 142 covering the semiconductor 130 is formed on the semiconductor 130. The second insulating layer 142 is formed by entirely depositing silicon nitride (SiNx) or silicon oxide ($SiO_2$) by a method such as PECVD. In addition, a pair of connection holes 41 and 42 exposing both ends of the first gate electrode 125, respectively, is formed by patterning the first insulating layer 141 and the second insulating layer 142 by a photolithography process using a third mask. In addition, a second gate metal layer is laminated on the second insulating layer 142. The second gate metal layer can be formed of the same material as the first gate metal layer. In addition, the second gate metal layer is patterned by a photolithography process using a fourth mask. As a result, a second gate wire including the second gate electrode 155 is formed. The second gate electrode 155 includes a second horizontal gate electrode 1551 formed on the second insulating layer 142, and a pair of second vertical gate electrodes 1552 filled in the pair of connection holes 41 and 42, respectively. Accordingly, the first gate electrode 125, the second horizontal gate electrode 1551, and the second vertical gate electrode 1552 surround the semiconductor 130 having a substantially cuboid shape. In addition, source/drain-doping at a higher doping concentration than the channel-doping is performed on the semiconductor 130. As a result, the channel region 133 is formed in a non-doped region which is covered by the second gate electrode 155, and the source region 131 and the drain region 132 are formed in an exposed region which is not covered by the second gate electrode 155. Accordingly, the first gate electrode 125, the second horizontal gate electrode 1551, and the second vertical gate electrode 1552 surround all sides of the channel region 133 of the semiconductor 130 to expand the current path, thereby improving charge mobility and minimizing leakage current.

Next, as illustrated in FIGS. 1 to 4, on the second gate electrode 155 and the second insulating layer 142, the third insulating layer 160 covering the second gate electrode 155 and the second insulating layer 142 is formed. The third insulating layer 160 is formed by entirely depositing silicon nitride (SiNx) or silicon oxide ($SiO_2$) by a method such as PECVD. In addition, a pair of contact holes 61 and 62 exposing the source region 131 and the drain region 132 of the semiconductor 130, respectively, is formed by pattering the second and third insulating layers 142 and 160 by a photolithography process using a fifth mask. In addition, a metal layer is laminated on the third insulating layer 160. The metal layer can be a multilayer in which a metal layer formed of any one of copper (Cu), a copper alloy, aluminum (Al), and an aluminum alloy and a metal layer formed of any one of molybdenum (Mo) and a molybdenum alloy are laminated. For example, the data metal layer is formed as a triple layer formed of titanium/aluminum/titanium (Ti/Al/Ti), a triple layer formed of molybdenum/aluminum/molybdenum (Mo/Al/Mo), or a triple layer formed of molybdenum/copper/molybdenum (Mo/Cu/Mo). In addition, the data metal layer is patterned by a photolithography process using a sixth mask. As a result, the data wire including the source and drain electrodes 176 and 177 is formed.

Meanwhile, the OLED display including the TFT according to the exemplary embodiment will be described below in detail with reference to FIGS. 1-4 and 11.

Figure 11:
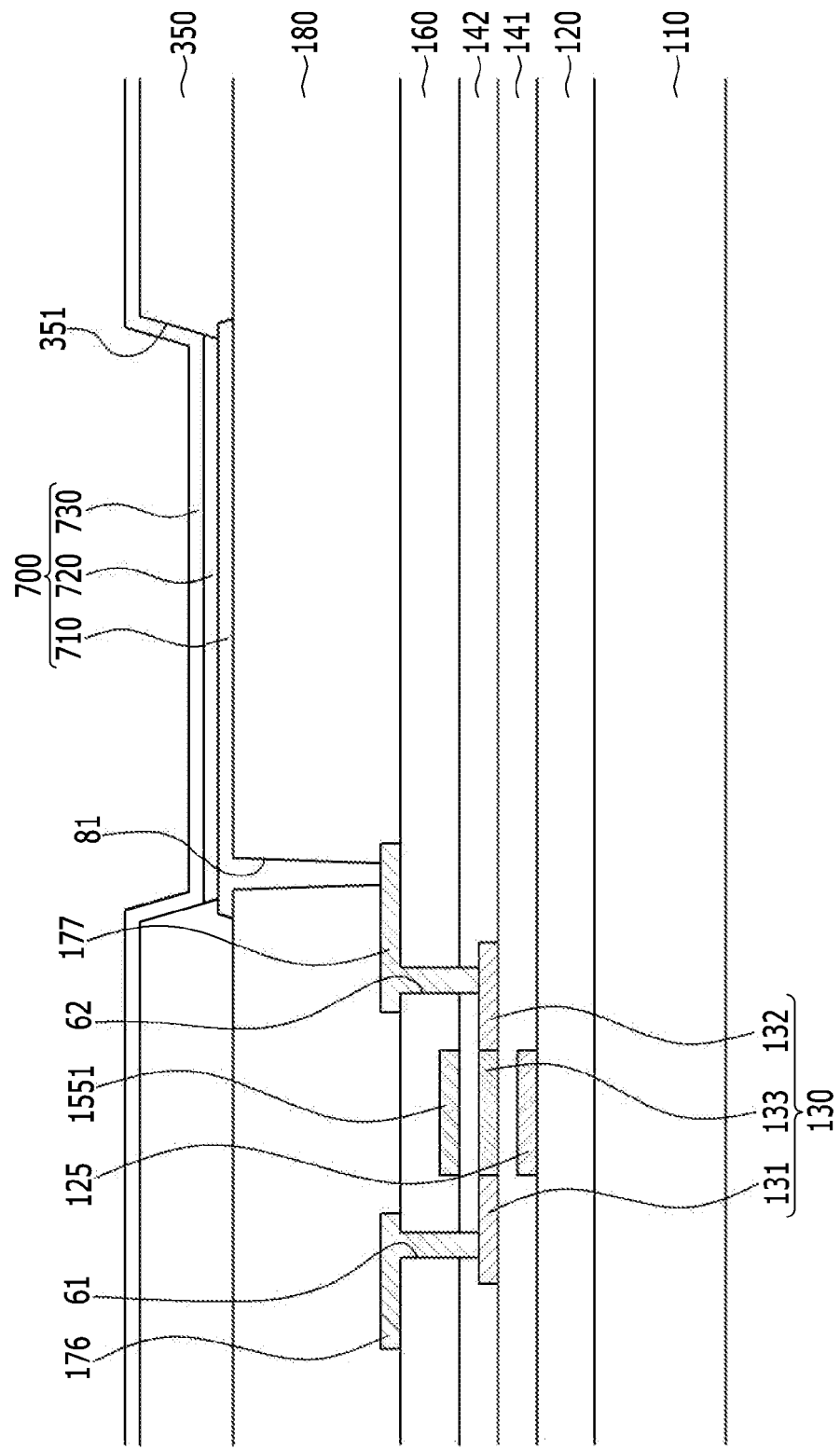
FIG. 11 is a cross-sectional view of the OLED display including the TFT according to the exemplary embodiment.

FIG. 11 is a cross-sectional view of the OLED display including the TFT according to the exemplary embodiment.

As illustrated in FIGS. 1-4 and 11, the buffer layer 120 is formed on the substrate 110 of the OLED display including the TFT. Also, the first gate electrode 125 is formed on the buffer layer 120, and the first insulating layer 141 is formed on the first gate electrode 125 and the buffer layer 120. On the first insulating layer 141, the semiconductor 130 divided into the channel region 133, the source region 131, and the drain region 132 is formed. On the semiconductor 130 and the first insulating layer 141, the second insulating layer 142 is formed. In the connection holes 41 and 42 and on the second insulating layer 142, the second gate electrode 155 is formed. The second gate electrode 155 includes a second horizontal gate electrode 1551 which is formed on the second insulating layer 142 and overlaps the channel region 133 and the first gate electrode 125. The second gate electrode 155 also includes a pair of second vertical gate electrodes 1552 filled in the pair of connection holes 41 and 42. Accordingly, the first gate electrode 125, the second horizontal gate electrode 1551, and the second vertical gate electrode 1552 surround all sides of the channel region 133 to expand the current path, thereby improving charge mobility and minimizing leakage current. The third insulating layer 160 is formed on the second gate electrode 155 and second insulating layer 142. The source and drain electrodes 176 and 177 are formed on the third insulating layer 160 and connected to the source and drain regions 131 and 132 through the contact holes 61 and 62. A passivation layer 180 is formed on the source electrode 176, the drain electrode 177 and third insulating layer 160. A pixel electrode 710 is formed on the passivation layer 180. The pixel electrode 710 is electrically connected to the drain electrode 177 through a contact hole 81 formed in the passivation layer 180 to become an anode of an OLED 700. A pixel defining layer 350 is formed on the passivation layer 180 and an edge of the pixel electrode 710. The pixel defining layer 350 has a pixel opening 351 exposing the pixel electrode 710. The pixel defining layer 350 can be formed of a resin such as polyacrylates or polyimides, a silica-based inorganic material, and the like. In the pixel opening 351, an organic emission layer 720 is formed. The organic emission layer 720 can be formed by multiple layers including at least one of a light emission layer, a hole injection layer (HIL), a hole transporting layer (HTL), an electron transporting layer (ETL), and an electron injection layer (EIL). When the organic emission layer 720 includes the layers, the hole injection layer is positioned on the pixel electrode 710 which is an anode. And, the hole transporting layer, the light emission layer, the electron transporting layer, and the electron injection layer can be sequentially laminated thereon.

A common electrode 730 is formed on the pixel defining layer 350 and the organic emission layer 720. The common electrode 730 can be formed by a reflective layer formed of a reflective material, or a transflective layer. The common electrode 730 becomes a cathode of the OLED 700. The pixel electrode 710, the organic emission layer 720, and the common electrode 730 form the OLED 700.

Meanwhile, in the exemplary embodiment, the second horizontal gate electrode as the island type is formed only at the TFT, but another exemplary embodiment in which the second horizontal gate electrode is formed as a part of an auxiliary gate line overlapping with the gate line to reduce the resistance of the gate line.

Hereinafter, a TFT according to another exemplary embodiment will be described in detail with reference to FIG. 12.

Figure 12:
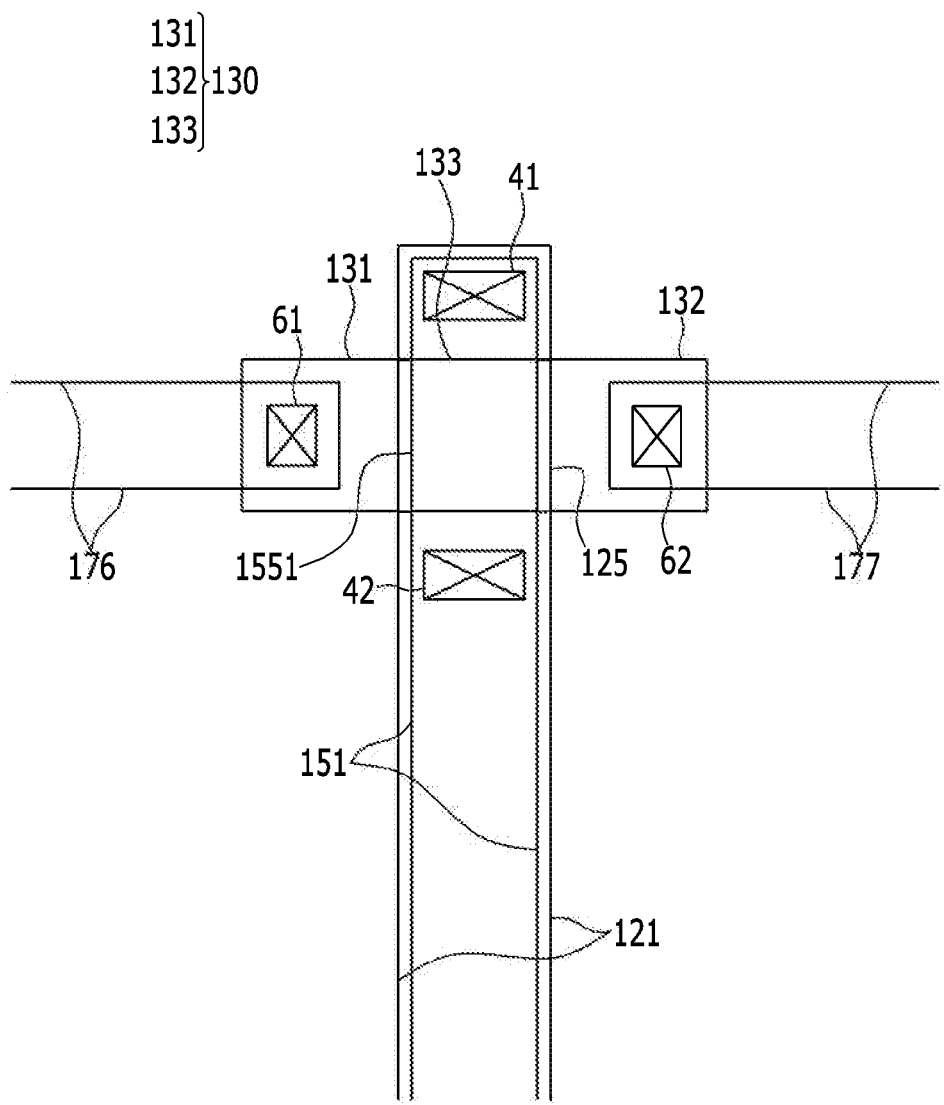
FIG. 12 is a layout view of a TFT according to another exemplary embodiment.

FIG. 12 is a layout view of a TFT according to another exemplary embodiment.

Another exemplary embodiment is substantially the same as the exemplary embodiment illustrated in FIGS. 1 to 4 except that a second horizontal gate electrode is formed by a part of an auxiliary gate line overlapping with a gate line, and duplicated descriptions are omitted.

As illustrated in FIG. 12, the TFT includes an auxiliary gate line 151 overlapping a gate line 121. An end of the auxiliary gate line 151 is corresponding to a second horizontal gate electrode 1551. Accordingly, the second horizontal gate electrode 1551 which is the end of the auxiliary gate line 151 is connected to a first gate electrode 125 which is an end of the gate line 121 through a pair of second vertical gate electrodes 1552 (see FIGS. 3 and 4) filled in a pair of connection holes 41 and 42 to reduce the resistance of the gate line 121.

Meanwhile, in the exemplary embodiment, polysilicon is used as the semiconductor, but yet another exemplary embodiment which an amorphous silicon or oxide semiconductor is used as the semiconductor is possible.

Hereinafter, a TFT according to yet another exemplary embodiment will be described in detail with reference to FIGS. 13 to 15.

Figure 13:
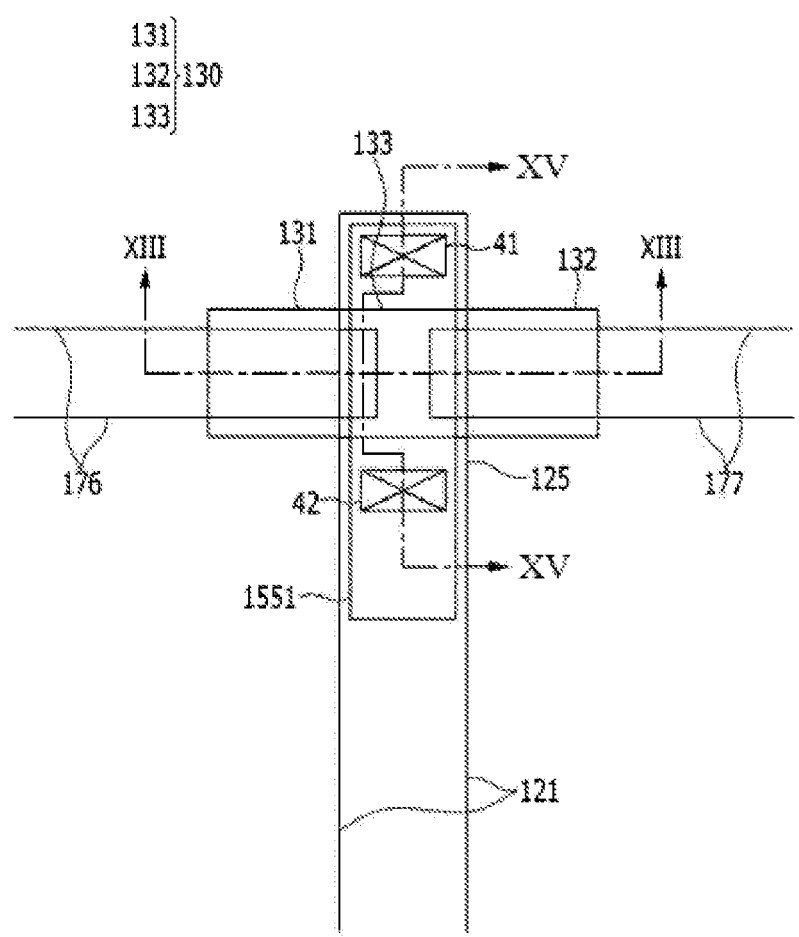
FIG. 13 is a layout view of a TFT according to yet another exemplary embodiment.

FIG. 13 is a layout view of a TFT. FIG. 14 is a cross-sectional view taken along line XIV-XIV of FIG. 13. FIG. 15 is a cross-sectional view taken along line XV-XV of FIG. 13.

Figure 14:
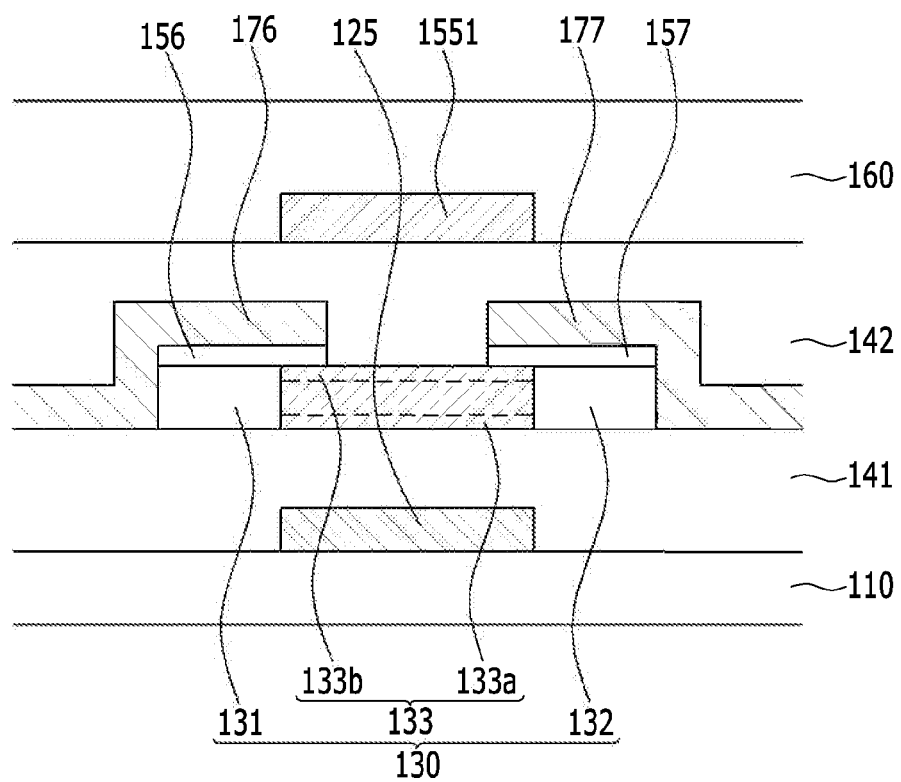
FIG. 14 is a cross-sectional view taken along line XIV-XIV of FIG. 13.
Figure 15:
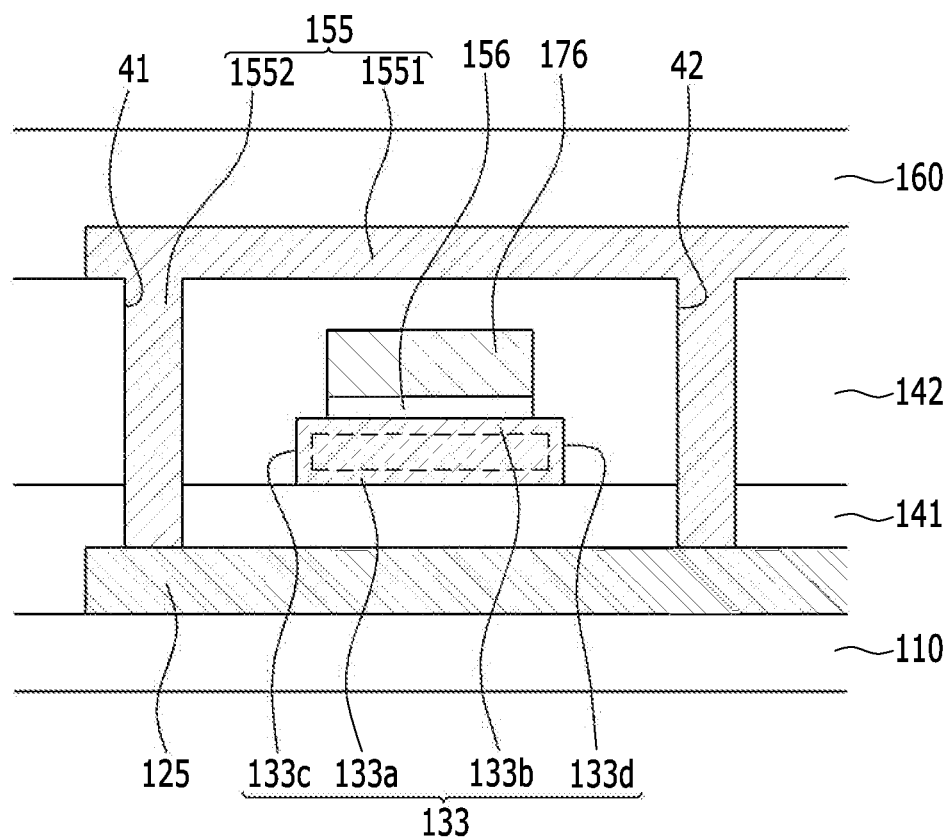
FIG. 15 is a cross-sectional view taken along line XV-XV of FIG. 13.

The embodiment illustrated in FIGS. 13 to 15 is substantially the same as the exemplary embodiment illustrated in FIGS. 1 to 4 except that an amorphous silicon or oxide semiconductor is used as a semiconductor and structures of a source electrode and a drain electrode are different. Therefore duplicated descriptions are omitted.

As illustrated in FIGS. 13 to 15, in the TFT, a first gate electrode 125 is formed on a substrate 110. The first gate electrode 125 corresponds to an end of a gate line 121 transferring a gate signal. On the first gate electrode 125 and the substrate 110, a first insulating layer 141 covering the first gate electrode 125 and the substrate 110 is formed. A semiconductor 130 is formed on the first insulating layer 141. The semiconductor 130 is formed to cross the first gate electrode 125. In the exemplary embodiment, the semiconductor 130 has a long rectangular shape in a horizontal direction in a plan view, but is not necessarily limited thereto and can have various structures. The semiconductor 130 includes a channel region 133 overlapping with the first gate electrode 125, and a source region 131 and a drain region 132 positioned at both ends of the channel region 133, respectively.

On the semiconductor 130, a pair of ohmic contacts 156 and 157 for reducing contact resistance is formed. The pair of ohmic contacts 156 and 157 can be formed of a material such as amorphous silicon in which an N-type impurity such as phosphorus (P) is doped at a high concentration or silicide.

The semiconductor 130 can be formed of an amorphous silicon or oxide semiconductor material. The oxide semiconductor material can include any one of oxide based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which is complex oxide thereof. In the case where the semiconductor 130 is formed of the oxide semiconductor material, a separate passivation layer for protecting the oxide semiconductor material which is vulnerable to an external environment such as a high temperature can be added. Further, when the semiconductor 130 is formed of the oxide semiconductor material, separate ohmic contacts 156 and 157 can be omitted.

On the ohmic contacts 156 and 157 and the first insulating layer 141, a source electrode 176 and a drain electrode 177 are formed to be separated from each other. The source and drain electrodes 176 and 177 are respectively connected to the source and drain regions 131 and 132 through the ohmic contacts 156 and 157. A second insulating layer 142 is formed on the source and drain electrodes 176 and 177 and the channel region 133.

A pair of connection holes 41 and 42 exposing both ends of the first gate electrode 125 is formed in the first and second insulating layers 141 and 142.

A second gate electrode 155 is formed in the connection holes 41 and 42 and on the second insulating layer 142. In the exemplary embodiment, the second gate electrode 155 has a long rectangular shape in a vertical direction in a plan view, but is not necessarily limited thereto and can have various structures. The second gate electrode 155 includes a second horizontal gate electrode 1551 which is formed on the second insulating layer 142 and overlaps the channel region 133 and the first gate electrode 125. The second gate electrode 155 also includes a pair of second vertical gate electrodes 1552 filled in the pair of connection holes 41 and 42. The second horizontal gate electrode 1551 is an island type in a plan view.

A pair of second vertical gate electrodes 1552 is respectively extended downward from both ends of the second horizontal gate electrode 1551 and respectively contacts both ends of the first gate electrode 125. Accordingly, the second gate electrode 155 is connected to the first gate electrode 125 through the connection holes 41 and 42 formed in the first and second insulating layers 141 and 142. In this case, the first gate electrode 125 faces the bottom of the channel region 133, the second horizontal gate electrode 1551 faces the top of the channel region 133, and the second vertical gate electrodes 1552 respectively face both sides of the channel region 133. Accordingly, the first gate electrode 125, the second horizontal gate electrode 1551 and the second vertical gate electrode 1552 surround all sides of the channel region 133. In this case, when the gate signal is applied to the first gate electrode 125, the second horizontal gate electrode 1551 and the second vertical gate electrode 1552, a lower portion 133a, an upper portion 133b, and two sides 133c and 133d of the channel region 133 are used as a current path to improve charge mobility. Further, when the TFT is in an off state, the current path is blocked from the lower portion 133a, the upper portion 133b, and the two sides 133c and 133d of the channel region 133 to minimize leakage current.

On the second gate electrode 155 and the second insulating layer 142, a third insulating layer 160 is formed.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor (TFT) for a display device, comprising:
   a substrate;
   a first gate electrode formed over the substrate;
   a first insulating layer formed over the substrate and the first gate electrode;
   a semiconductor layer formed over the first insulating layer, wherein the semiconductor layer at least partially overlaps the first gate electrode;
   a second insulating layer formed over the first insulating layer and the semiconductor layer, wherein the first and second insulating layers have a pair of connection holes formed therethrough, the pair of connection holes including a first connection hole and a second connection hole that are formed on opposing sides of the semiconductor layer;
   a second gate electrode electrically connected to the first gate electrode via the connection holes, wherein the connection holes respectively expose portions of the first gate electrode;
   a third insulating layer formed over the second gate electrode and the second insulating layer, wherein the second and third insulating layers have a pair of contact holes formed therethrough; and
   source and drain electrodes formed over the third insulating layer and electrically connected to the semiconductor layer via the contact holes, wherein the contact holes respectively expose portions of the semiconductor layer,
   wherein the second gate electrode includes i) a second horizontal gate electrode formed over the second insulating layer and at least partially overlapping the semiconductor layer and the first gate electrode and ii) a pair of second vertical gate electrodes respectively formed in the connection holes,
   wherein the second vertical gate electrodes extend downwardly from different portions of the second horizontal gate electrode,
   wherein the semiconductor layer includes i) a channel region including first and second ends opposing each other, the channel region at least partially overlapping the first gate electrode and the second horizontal gate electrode and ii) source and drain regions respectively formed at the first and second ends of the channel region, and wherein the first gate electrode, the second horizontal gate electrode, and the second vertical gate electrodes surround the channel region.

2. The TFT of claim 1, wherein the semiconductor layer is formed of polysilicon.

3. The TFT of claim 1, wherein the source and drain electrodes respectively contact the exposed portions of the semiconductor layer.

4. The TFT of claim 1, wherein the second vertical gate electrodes respectively contact the exposed portions of the first gate electrode.

5. The TFT of claim 1, further comprising a gate line configured to transmit a gate signal to the first gate electrode,
   wherein the first gate electrode is electrically connected to an end of the gate line, and
   wherein the second horizontal gate electrode has a substantially rectangular shape in a plan view.

6. The TFT of claim 1, further comprising:
   a gate line configured to transmit a gate signal to the first gate electrode; and
   an auxiliary gate line at least partially overlapping the gate line,
   wherein the first gate electrode is electrically connected to an end of the gate line, and
   wherein the second horizontal gate electrode is electrically connected to an end of the auxiliary gate line.

7. The TFT of claim 1, wherein the first and second vertical and horizontal gate electrodes are connected to each other to form a closed loop.

8. A thin film transistor (TFT), comprising:
a substrate;
a first gate electrode formed over the substrate;
a first insulating layer formed over the substrate and the first gate electrode;
a semiconductor layer formed over the first insulating layer, wherein the semiconductor layer at least partially overlaps the first gate electrode;
a second insulating layer formed over the semiconductor layer wherein the first and second insulating layers have a pair of connection holes formed therethrough, the pair of connection holes including a first connection hole and a second connection hole that are formed on opposing sides of the semiconductor layer;
a second gate electrode electrically connected to the first gate electrode via the connection holes, wherein the connection holes respectively expose portions of the first gate electrode; and
a third insulating layer formed over the second gate electrode and the second insulating layer.

9. The TFT of claim 8, wherein the second gate electrode includes i) a second horizontal gate electrode formed over the second insulating layer and at least partially overlapping the semiconductor layer and the first gate electrode and ii) a pair of second vertical gate electrodes respectively formed in the connection holes.

10. The TFT of claim 9, wherein the second vertical gate electrodes respectively extend downwardly from different portions of the second horizontal gate electrode.

11. The TFT of claim 9, wherein the second vertical gate electrodes respectively contact the exposed portions of the first gate electrode.

12. The TFT of claim 10, wherein the semiconductor layer is formed of an amorphous silicon or oxide semiconductor material.

13. The TFT of claim 10, wherein the semiconductor layer includes i) a channel region including first and second ends opposing each other, the channel region at least partially overlapping the first gate electrode and the second horizontal gate electrode and ii) source and drain regions respectively formed at the first and second ends of the channel region, and wherein the first gate electrode, the second horizontal gate electrode, and the second vertical gate electrodes surround the channel region.

14. The TFT of claim 13, wherein source and drain electrodes respectively contact the exposed portions of the semiconductor layer.

15. The TFT of claim 13, further comprising:
a source ohmic contact formed between a source electrode and the source region; and
a drain ohmic contact formed between a drain electrode and the drain region.

16. The TFT of claim 8, further comprising source and drain electrodes respectively contacting portions of the semiconductor layer and separated from each other,
wherein the second insulating layer is formed on the source and drain electrodes.

17. An organic light-emitting diode (OLED) display, comprising:
a substrate;
a thin film transistor (TFT) formed over the substrate; and
an OLED connected to the TFT,
wherein the TFT includes:
a first gate electrode formed over the substrate;
a first insulating layer formed over the substrate and the first gate electrode;
a semiconductor layer formed over the first insulating layer, wherein the semiconductor layer at least partially overlaps the first gate electrode;
a second insulating layer formed over the first insulating layer and the semiconductor layer, wherein the first and second insulating layers have a pair of connection holes formed therethrough, the pair of connection holes including a first connection hole and a second connection hole that are formed on opposing sides of the semiconductor layer;
a second gate electrode electrically connected to the first gate electrode via the connection holes, wherein the connection holes respectively expose portions of the first gate electrode;
a third insulating layer formed over the second gate electrode and the second insulating layer.

18. The OLED display of claim 17, wherein the second gate electrode includes i) a second horizontal gate electrode formed over the second insulating layer and at least partially overlapping the semiconductor layer and the first gate electrode and ii) a pair of second vertical gate electrodes respectively formed in the connection holes.

19. The OLED display of claim 18, wherein the semiconductor layer includes i) a channel region including first and second ends opposing each other, the channel region at least partially overlapping the first gate electrode and the second horizontal gate electrode and ii) source and drain regions respectively formed at the first and second ends of the channel region, and wherein the first gate electrode, the second horizontal gate electrode, and the second vertical gate electrodes surround the channel region.

20. The OLED display of claim 19, wherein the second vertical gate electrodes respectively contact the exposed portions of the first gate electrode.

21. The OLED display of claim 17, wherein the second and third insulating layers have a pair of contact holes formed therethrough, and the OLED display further comprises:
source and drain electrodes formed over the third insulating layer and electrically connected to the semiconductor layer via the contact holes, wherein the contact holes respectively expose portions of the semiconductor layer.

22. A manufacturing method of a thin film transistor (TFT), comprising:
forming a first gate electrode over a substrate, wherein the first gate electrode has two ends;
forming a first insulating layer over the first gate electrode;
forming a semiconductor layer, having two ends, over the first insulating layer so as to at least partially overlap the first gate electrode, wherein the two ends of the first gate electrode include a first end and a second end that are on opposing sides of the semiconductor layer;
forming a second insulating layer over the first insulating layer and the semiconductor layer, wherein the first and second insulating layers have a pair of connection holes formed therethrough, and wherein the connection holes respectively expose the first and second ends of the first gate electrode;
forming a second gate electrode over the second insulating layer, wherein the second gate electrode is electrically connected to the first gate electrode via the connection holes;

forming a third insulating layer over the second gate electrode and the second insulating layer.

23. The method of claim 22, wherein the second gate electrode includes i) a second horizontal gate electrode formed over the second insulating layer and at least partially overlapping the semiconductor layer and the first gate electrode and ii) a pair of second vertical gate electrodes respectively formed in the connection holes.

24. The method of claim 23, wherein the semiconductor layer includes i) a channel region including first and second ends opposing each other, the channel region at least partially overlapping the first gate electrode and the second horizontal gate electrode, and wherein the first gate electrode, the second horizontal gate electrode, and the second vertical gate electrodes surround the channel region.

25. The method of claim 22, wherein the second and third insulating layers have a pair of contact holes formed therethrough, and wherein the contact holes respectively expose the ends of the semiconductor layer, and the method further comprising:

forming source and drain electrodes over the third insulating layer, wherein the source and drain electrodes are electrically connected to the semiconductor layer via the contact holes.

* * * * *